(12) United States Patent
Zhang et al.

(10) Patent No.: US 11,469,392 B2
(45) Date of Patent: Oct. 11, 2022

(54) DISPLAY PANEL, DISPLAY DEVICE AND METHOD FOR MANUFACTURING DISPLAY PANEL

(71) Applicant: BOE TECHNOLOGY GROUP CO., LTD., Beijing (CN)

(72) Inventors: Ziyu Zhang, Beijing (CN); Chunyan Xie, Beijing (CN); Song Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 272 days.

(21) Appl. No.: 16/649,530

(22) PCT Filed: Sep. 27, 2019

(86) PCT No.: PCT/CN2019/108425
§ 371 (c)(1),
(2) Date: Mar. 20, 2020

(87) PCT Pub. No.: WO2020/114052
PCT Pub. Date: Jun. 11, 2020

(65) Prior Publication Data
US 2021/0376290 A1   Dec. 2, 2021

(30) Foreign Application Priority Data
Dec. 5, 2018   (CN) .......................... 201811479243.2

(51) Int. Cl.
*H01L 51/52* (2006.01)
*H01L 27/32* (2006.01)
(Continued)

(52) U.S. Cl.
CPC ...... *H01L 51/5237* (2013.01); *H01L 27/3258* (2013.01); *H01L 27/3262* (2013.01);
(Continued)

(58) Field of Classification Search
CPC ..... H01L 51/5237–5259; H01L 29/458; H01L 29/45
See application file for complete search history.

(56) References Cited

U.S. PATENT DOCUMENTS 10,312,464 B2 * 6/2019 Rothe ................. H01L 51/0059
10,553,819 B2 * 2/2020 Kim .................... H01L 27/3244
(Continued)

FOREIGN PATENT DOCUMENTS

CN   108649133 A   10/2018
CN   108666347 A   10/2018
(Continued)

*Primary Examiner* — Victoria K. Hall
(74) *Attorney, Agent, or Firm* — The Webb Law Firm

(57) ABSTRACT

The present disclosure relates to a display panel, a display device, and a method for manufacturing a display panel. The display panel includes a display area, an aperture area, and an inner non-display area between the display area and the aperture area. The display area is arranged with an electroluminescent device. The electroluminescent device includes a common layer extending to the inner non-display area. The inner non-display area is arranged with a partition bar at least partially surrounding the aperture area. The common layer located in the inner non-display area is partitioned by the partition bar.

18 Claims, 5 Drawing Sheets

(51) Int. Cl.
*H01L 51/56* (2006.01)
*H01L 29/45* (2006.01)

(52) U.S. Cl.
CPC ........ *H01L 29/458* (2013.01); *H01L 51/5206* (2013.01); *H01L 51/5221* (2013.01); *H01L 51/5253* (2013.01); *H01L 51/56* (2013.01); *H01L 27/3225* (2013.01); *H01L 27/3246* (2013.01); *H01L 27/3248* (2013.01); *H01L 51/525* (2013.01); *H01L 2227/323* (2013.01)

(56) References Cited

U.S. PATENT DOCUMENTS

| | | | | |
|---|---|---|---|---|
| 11,302,895 | B2* | 4/2022 | Zou | H01L 51/525 |
| 2017/0148856 | A1* | 5/2017 | Choi | H01L 27/3258 |
| 2017/0346020 | A1* | 11/2017 | Lee | H01L 51/0073 |
| 2018/0108872 | A1* | 4/2018 | Li | H01L 51/5064 |
| 2018/0122954 | A1* | 5/2018 | Kim | H01L 29/78618 |
| 2018/0166525 | A1* | 6/2018 | Kim | G01N 27/20 |
| 2018/0342700 | A1 | 11/2018 | Cai et al. | |
| 2019/0319214 | A1 | 10/2019 | Taniyama et al. | |
| 2019/0333972 | A1* | 10/2019 | Ding | H01L 27/3281 |
| 2019/0334120 | A1* | 10/2019 | Seo | H01L 51/5253 |
| 2020/0006682 | A1* | 1/2020 | Seo | H01L 51/56 |
| 2020/0006700 | A1* | 1/2020 | Kim | H01L 27/3258 |
| 2020/0006701 | A1* | 1/2020 | Lee | H01L 27/3258 |
| 2020/0052054 | A1* | 2/2020 | Park | H01L 27/3225 |
| 2020/0083475 | A1* | 3/2020 | Kang | H01L 27/3225 |
| 2020/0106045 | A1* | 4/2020 | Han | H01L 27/3234 |
| 2020/0119304 | A1* | 4/2020 | Choi | H01L 51/5237 |
| 2020/0161582 | A1* | 5/2020 | Choi | H01L 27/326 |
| 2020/0176538 | A1* | 6/2020 | Um | H01L 51/5253 |
| 2020/0176709 | A1* | 6/2020 | Moon | G06F 3/0443 |
| 2020/0235333 | A1* | 7/2020 | Sung | G06F 1/1686 |
| 2021/0151707 | A1* | 5/2021 | Huang | H01L 51/5246 |
| 2021/0234122 | A1* | 7/2021 | Choi | H01L 51/0096 |
| 2021/0234125 | A1* | 7/2021 | Sung | H01L 27/3258 |
| 2021/0336189 | A1* | 10/2021 | Li | H01L 51/56 |
| 2021/0343981 | A1* | 11/2021 | Xie | H01L 51/56 |
| 2022/0020958 | A1* | 1/2022 | Okabe | H01L 27/3244 |

FOREIGN PATENT DOCUMENTS

| | | |
|---|---|---|
| CN | 108777258 A | 11/2018 |
| CN | 110164916 A | 8/2019 |
| WO | 2018229991 A1 | 12/2018 |

* cited by examiner

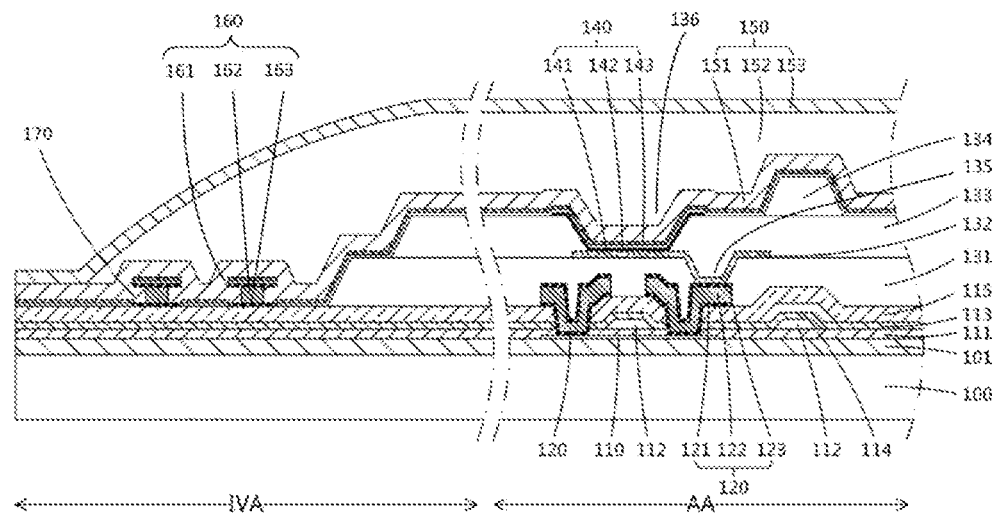
FIG. 5
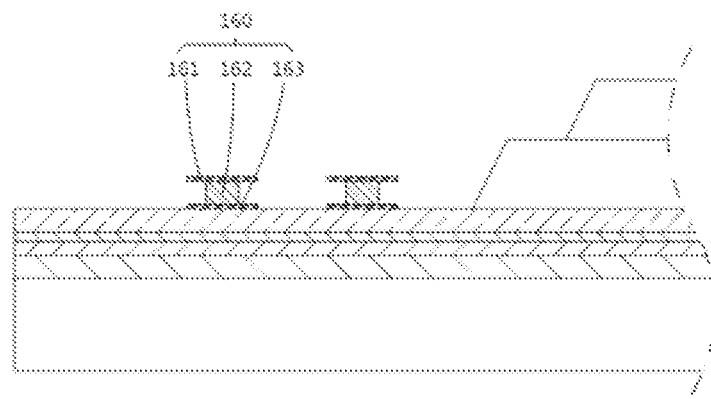
FIG. 6
Forming a partition bar at least partially surrounding the aperture area in the inner non-display area — 200
FIG. 7

DISPLAY PANEL, DISPLAY DEVICE AND METHOD FOR MANUFACTURING DISPLAY PANEL

CROSS-REFERENCE TO RELATED APPLICATIONS

This application is a U.S. National Stage under 35 U.S.C. § 371 of International Application No. PCT/CN2019/108425, as filed on Sep. 27, 2019, which claims priority to Chinese Patent Application No. 201811479243.2 entitled "Display Panel, Display Device, and Method for Manufacturing Display Panel", filed on Dec. 5, 2018. The disclosure of each of these applications is incorporated herein by reference in its entirety.

TECHNICAL FIELD

The present disclosure relates to the field of display technology, and particularly to a display panel, a display device, and a method for manufacturing a display panel.

BACKGROUND

With the continuous development of display technology, more and more display panels adopt irregular shapes. For example, some display panels have apertures in the middle, while others have depressions on the edges, and so on. These irregular shapes may subject the internal devices of the display panel to water and oxygen erosion.

SUMMARY

According to an aspect of the present disclosure, there is provided a display panel. The display panel includes a display area, an aperture area, and an inner non-display area between the display area and the aperture area. The display area is arranged with an electroluminescent device. The electroluminescent device includes a common layer extending to the inner non-display area. The inner non-display area is arranged with a partition bar at least partially surrounding the aperture area, and the common layer located in the inner non-display area is partitioned by the partition bar.

In some embodiments, the partition bar includes a first layer and a second layer. The first layer is farther from a substrate of the display panel than the second layer. The width of the first layer is greater than the width of the second layer. The first layer includes a bottom surface facing the second layer, and a portion of the bottom surface that does not contact the second layer and a side surface of the second layer define a side etching channel.

In some embodiments, the display panel further includes an inorganic layer covering the common layer. At least a portion of the inorganic layer fills the side etching channel.

In some embodiments, the thickness of the second layer in a direction perpendicular to the substrate is greater than the thickness of the common layer in a direction perpendicular to the substrate.

In some embodiments, the thickness of the second layer in a direction perpendicular to the substrate ranges from 0.5 to 5 μm.

In some embodiments, the material of the first layer has greater etching resistance than the material of the second layer.

In some embodiments, the material of the first layer includes at least one of titanium, gold, and platinum, and the material of the second layer includes at least one of aluminum, copper, or silver.

In some embodiments, the display panel includes a pixel circuit, and the pixel circuit includes a thin film transistor. The source and drain of the thin film transistor include a third layer and a fourth layer, wherein the third layer is farther from the substrate than the fourth layer. The material of the third layer is the same as that of the first layer. The material of the fourth layer is the same as that of the second layer.

In some embodiments, the partition bar further includes a fifth layer closer to the substrate than the second layer. The width of the fifth layer is greater than that of the second layer.

In some embodiments, the source and drain further include a sixth layer closer to the substrate than the fourth layer. The material of the fifth layer is the same as that of the sixth layer.

In some embodiments, the thin film transistor further includes a first gate dielectric layer, a second gate dielectric layer, and an interlayer dielectric layer, and the first gate dielectric layer, the second gate dielectric layer, and the interlayer dielectric layer extend to the inner non-display area.

In some embodiments, the common layer includes a common organic layer and a cathode.

In some embodiments, the electroluminescent device includes an organic light emitting diode device and a quantum dot light emitting diode device.

According to another aspect of the present disclosure, there is provided a display device, including a display panel according to an embodiment of the present disclosure.

According to yet another aspect of the present disclosure, there is provided a method for manufacturing a display panel. The display panel includes a display area, an aperture area, and an inner non-display area between the display area and the aperture area. The display area is arranged with an electroluminescent device. The electroluminescent device includes a common layer extending to the inner non-display area. The method includes forming a partition bar at least partially surrounding the aperture area in the inner non-display area. The partition bar is configured to partition the common layer.

In some embodiments, the step of forming a partition bar at least partially surrounding the aperture area in the inner non-display area includes: providing a first material layer and a second material layer; patterning the first material layer into a first layer and patterning the second material layer into a semi-fabricated second layer by dry etching, wherein the side surface of the first layer is flush with the side surface of the semi-fabricated second layer; and patterning the semi-manufactured second layer into a second layer by wet etching, so that the portion of the bottom surface of the first layer that does not contact the second layer and the side surface of the second layer define a side etching channel.

In some embodiments, the method further comprises: forming an inorganic layer covering the common layer by chemical vapor deposition or atomic layer deposition, wherein at least a portion of the inorganic layer fills the side etching channel.

In some embodiments, the method further includes: forming a source and a drain of the pixel circuit while patterning the first material layer into a first layer and patterning the second material layer into a semi-fabricated second layer by dry etching.

In some embodiments, the method further comprises: forming an anode of the electroluminescent device while patterning the semi-manufactured second layer into a second layer by wet etching.

BRIEF DESCRIPTION OF THE DRAWINGS

Embodiments of the present invention are described in more detail and by way of non-limiting examples with reference to the accompanying drawings, in which:

FIG. 5 schematically illustrates a cross-sectional view of a display panel according to another embodiment of the present disclosure;

FIG. 6 schematically illustrates an enlarged view of a partial structure of the display panel of FIG. 5;

FIG. 7 schematically illustrates a flowchart of a method for manufacturing a display panel according to an embodiment of the present disclosure;

DETAILED DESCRIPTION

Figure 1:
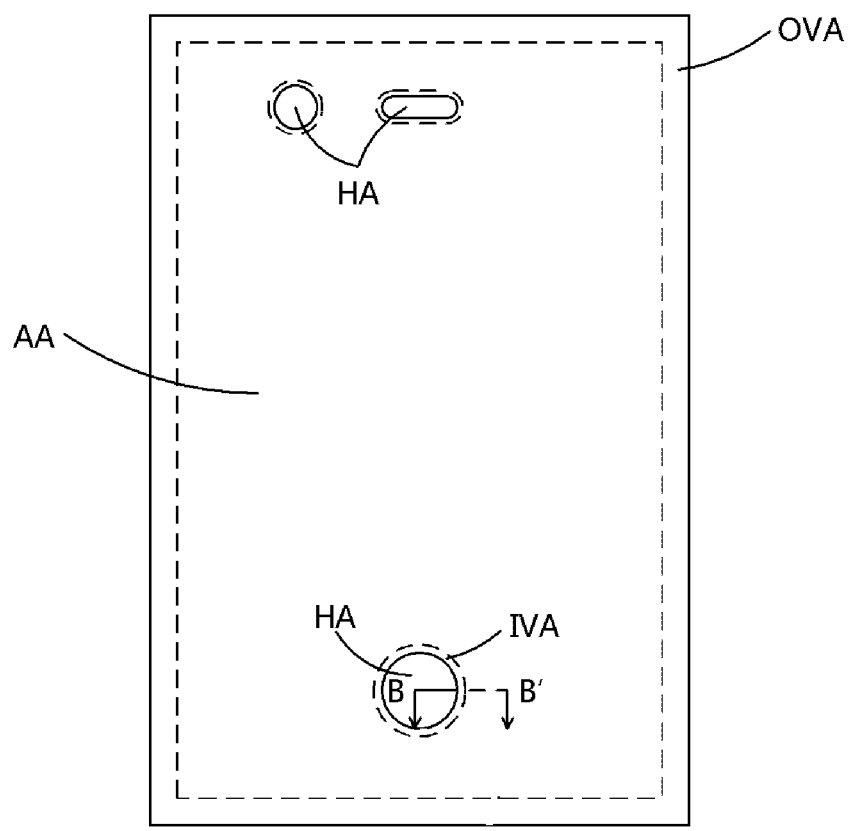
FIG. 1 schematically illustrates a structure of a display panel according to an embodiment of the present disclosure.

A common display panel is generally a full surface display. The edges of the display area of the full surface display panel have a regular geometric shape and there are no apertures inside, and the form is a continuous plane. As the demand for the display panel changes, sometimes the display panel is required to adopt a non-full surface display (also known as a special-shaped display). The non-full surface display panel includes a panel with an irregular shape at the edge of the display area and a panel with apertures inside the display area. In the following, the irregular edge area and the internal aperture area are collectively referred to as the aperture area. Non-full surface display panels can increase the effective display area or provide space to accommodate other devices. According to different needs, various devices can be arranged at the apertures. For example, in an aperture of a display area of a mobile device, devices such as speakers, loudspeakers, various sensors, various cameras, dot matrix projectors, light sources, fingerprint readers, buttons, etc. can be accommodated. As another example, in a display panel that combines mechanical instructions and electronic display (such as a dashboard with an electronic display interface), a hole can be opened in the middle of the display panel to accommodate mechanical devices (such as the shaft of a pointer).

Organic Light Emitting Diode (OLED) display devices are a type of display device that is becoming more and more widely used. The OLED display device is driven by a thin film transistor of an active matrix, and the organic layer emits light autonomously, and it does not need a backlight, nor does it need a liquid crystal and a light guide plate. Therefore, it is more favorable to the processing of special-shaped displays. Quantum dot Light Emitting Diode (QLED) is a light emitting technology similar to OLED technology, with the main difference that the light emitting center of QLED is composed of quantum dot substance. QLED requires less power in electro-optical conversion and has certain advantages in terms of energy saving.

At present, the common organic layer and the cathode of the electroluminescent device of the OLED display panel and the QLED display panel are usually masked using an open mask. This method can only be used to deposit continuous material layers, but cannot deposit patterned material layers. Because the common layer and cathode of the electroluminescent device cannot be patterned, the thin film encapsulated inorganic layer cannot completely clad the common layer and the cathode of the electroluminescent device in the aperture area, especially side surfaces of these layers, so that these layers may be exposed outside of the protection of the encapsulation layer and suffer water and oxygen erosion, thus causing the display panel failure. Therefore, certain measures need to be taken to block the water and oxygen in the aperture area from eroding the electroluminescent device from the side surfaces, thereby improving the reliability of the display panel.

According to an aspect of the present disclosure, there is provided a display panel. FIG. 1 schematically illustrates a structure of a display panel according to an embodiment of the present disclosure. As shown in FIG. 1, the display panel includes a display area AA and an outer non-display area OVA surrounding the display area AA. There is an aperture area HA in the display area AA. In some embodiments, the aperture area HA runs throughout the display panel. Various devices can be arranged therein according to the size and shape of the aperture area HA. In the display panel of FIG. 1, the aperture area HA is arranged inside the display area AA. However, it should be understood that, in other embodiments, the aperture area HA may be arranged at the edge of the display area AA. In this case, the display area AA partially surrounds the aperture area HA, and the outer non-display area OVA surrounds the other parts of the aperture area HA.

There is an inner non-display area IVA between the display area AA and the aperture area HA, that is, the inner non-display area IVA surrounds the aperture area HA and the display area AA surrounds the inner non-display area IVA. In the display panel where the aperture area HA is located at the edge of the display area AA, the inner non-display area IVA partially surrounds the aperture area HA.

Figure 2:
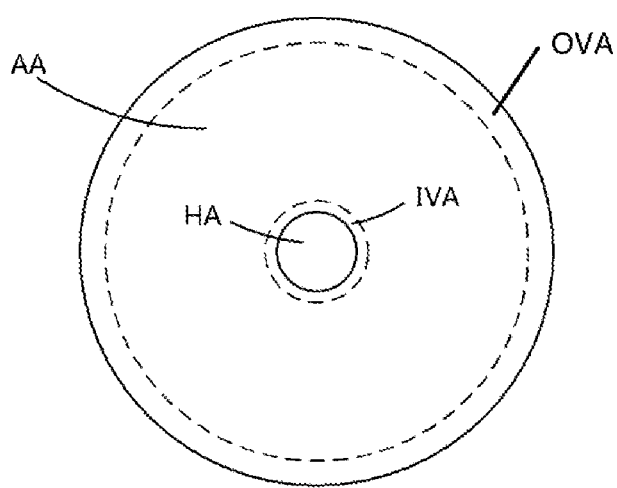
FIG. 2 schematically illustrates a structure of a display panel according to another embodiment of the present disclosure.

FIG. 2 schematically illustrates a structure of a display panel according to another embodiment of the present disclosure. As shown in FIG. 2, the display panel may be circular. The aperture area HA is arranged in the display area AA. In this case, the display area AA is annular. The outer non-display area OVA surrounds the display area AA. In the aperture area HA, various mechanical or electronic components can be arranged. For example, the display panel may be a dial of an instrument or a watch, and a shaft for driving a pointer may be arranged in the aperture area HA. Of course, circular display panels have many other applications.

Accordingly, various devices may be arranged in the aperture area HA, and the present disclosure does not limit on this.

In addition to the embodiments shown in FIGS. 1 and 2, the display panel of the present disclosure may have other shapes, and the aperture area HA may be arranged at other positions. This disclosure also does not limit on this.

Figure 3:
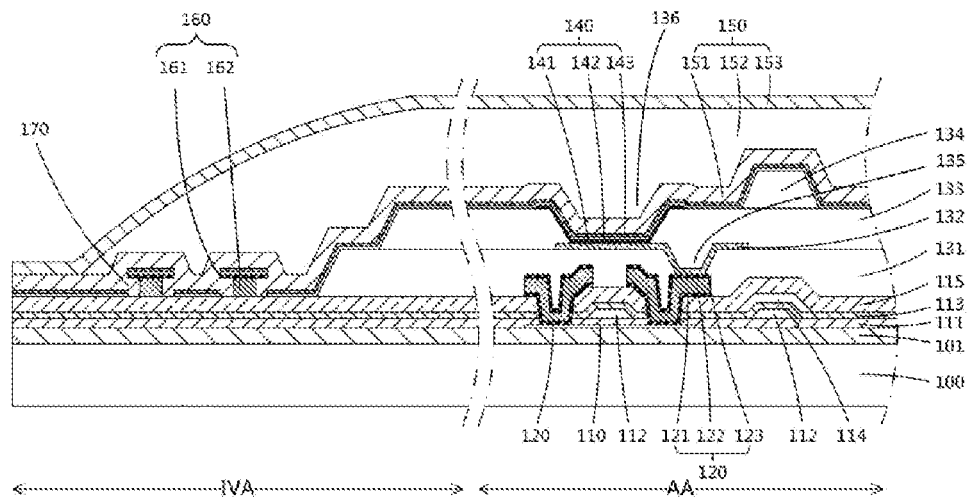
FIG. 3 schematically illustrates a cross-sectional view of a display panel according to an embodiment of the present disclosure.

FIG. 3 schematically illustrates a cross-sectional view of a display panel according to an embodiment of the present disclosure. Specifically, FIG. 3 schematically illustrates a cross-section of a display panel along the line BB' of FIG. 1 according to an embodiment of the present disclosure. The display panel includes a substrate 100. In some embodiments, the substrate 100 may be a flexible substrate. A barrier layer 101 is arranged on the substrate 100, which can block the penetration of water and oxygen. The blocking layer 101 exists in the display area AA and the inner non-display area IVA. The barrier layer 101 may be composed of a multilayer inorganic material. In the display area AA, a pixel circuit is arranged on the barrier layer 101. In some embodiments, the pixel circuit may include a thin film transistor, which specifically includes a channel layer 110, a first gate dielectric layer 111, a first gate 112, an interlayer dielectric layer 115, and a source and drain 120. As shown in FIG. 3, the thin film transistor may further include a second gate 114 and a second gate dielectric layer 113. By arranging the second gate 114, it is possible to store electricity and maintain the gate voltage of the pixel circuit to be stable. The term source and drain refers to a pair of two electrodes, one of which is the source of a thin film transistor and the other is the drain of the thin film transistor. In some embodiments, the source and drain 120 are composed of three layers of metal, including a third layer 123 furthest from the substrate 100, a sixth layer 121 closest to the substrate 100, and a fourth layer 122 between the third layer 123 and the sixth layer 121. It should be understood that the terms "third", "fourth", and "sixth" do not indicate any order and positional relationship, they are only used for naming. The third layer 123 and the sixth layer 121 are relatively stable metals, such as titanium Ti, gold Au, platinum Pt, and the like. The fourth layer 122 is a metal with more prominent conductivity, such as aluminum Al, copper Cu, silver Ag, and the like. A typical source/drain structure is a Ti/Al/Ti stack. In other embodiments, the source and drain 120 may include only the third layer 123 and the fourth layer 122. The first gate dielectric layer 111, the second gate dielectric layer 113, and the interlayer dielectric layer 115 of the thin film transistor extend to the inner non-display area IVA. The thin film transistor illustrated in FIG. 3 uses a top-gate structure. It should be understood that, in other embodiments, the thin film transistor may be a bottom-gate or double-gate structure, and this disclosure does not limit on this.

A planarization layer 131 is provided above the pixel circuit. The planarization layer 131 can smooth the in-plane segment gap caused by various layer patterns of the display panel. Using the planarization layer 131 can reduce the area of the black matrix, increase the aperture ratio of the panel, increase the light transmittance, and reduce the power consumption of the product. There is a first aperture 135 on the planarization layer 131 so that one of the source and drain 120 is exposed. In the embodiment of FIG. 3, the drain is exposed through the first aperture 135. An electroluminescent device 140 is provided above the pixel circuit. The electroluminescent device 140 may be an OLED or a QLED. The anode 132 of the electroluminescent device 140 is connected to the pixel circuit through the first aperture 135. A pixel definition layer 133 is provided above the planarization layer 131 and the anode 132. The pixel definition layer 133 includes a non-aperture area and a second aperture 136. The position of the second aperture 136 corresponds to the anode 132 of the electroluminescent device 140. Various layers of the electroluminescent device 140 are formed on the pixel definition layer 133 (including the second aperture 136). A part of the layers of the electroluminescent device 140 is arranged only in the display area AA, and another part of the layers may extend to the inner non-display area IVA. In the present disclosure, a layer of the electroluminescent device 140 extending to the inner non-display area IVA is referred to as a common layer. In some embodiments, the common layer includes a common organic layer 142 and a cathode 143. The electroluminescent device 140 may further include a light emitting material layer 141 and an optical adjustment layer. The optical adjustment layer can help display panels to match on the refractive index and reduce the reflection from other dielectric layers. It should be understood that the term common organic layer 142 does not refer to only one layer. In fact, the common organic layer 142 may be a stack of multiple layer structures, including but not limited to an electron transport layer and a hole transport layer. In addition, although the common organic layer 142 is depicted below the cathode 143 in FIG. 3, the cathode 143 may be sandwiched between the stacks of the common organic layer when the common organic layer 142 is a stack. A support pillar 134 may be provided on the pixel definition layer 133. The support pillar 134 is located on the non-aperture area of the pixel definition layer 133 and is used to support the mask plate when forming a layer structure. In some embodiments, the same Half Tone Mask may be used to form the pixel definition layer 133 and the support pillar 134.

Figure 4:
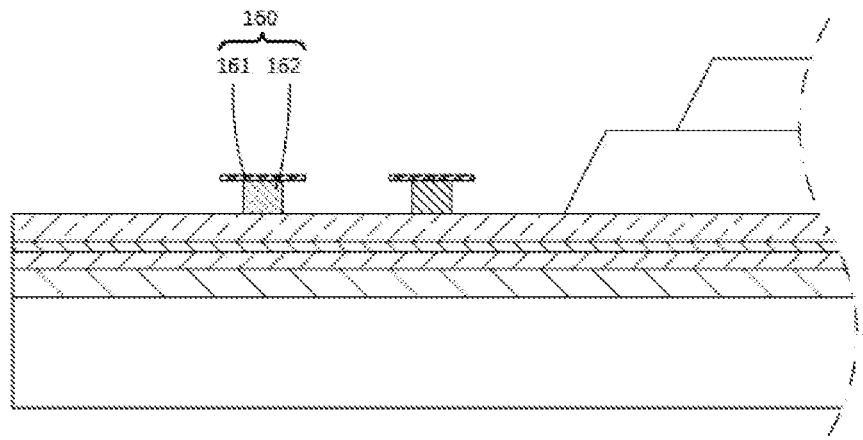
FIG. 4 schematically illustrates an enlarged view of a partial structure of the display panel of FIG. 3.

FIG. 4 schematically illustrates an enlarged view of a partial structure of the display panel of FIG. 3. A partition bar 160 is arranged on the inner non-display area IVA. In some embodiments, the barrier ribs 160 are formed on the interlayer dielectric layer 115. In the embodiment of FIG. 3, the display panel includes two partition bars 160. The partition bar farther from the hole area HA surrounds the partition bar closer to the aperture area HA. However, the present disclosure does not limit the number of partition bars. When the common layer is formed in the inner non-display area IVA, the common layer is partitioned by the partition bar 160. The term "partition" means that the layer structure is physically separated so that water and oxygen erosion cannot be transmitted. Therefore, the erosion of the common layer by the water and oxygen from the aperture area HA will stop at the partition bar 160.

In some embodiments, the partition bar 160 includes two portions having different widths in a direction perpendicular to the substrate 100. Specifically, the partition bar 160 may include two layers, a first layer 161 farther from the substrate 100 and a second layer 162 closer to the substrate 100, respectively. In a more specific embodiment, the thickness of the second layer 162 is greater than the thickness of the common layer, so that the height of the top surface of the common layer formed on the interlayer dielectric layer 115 is lower than the lowest point of the common layer formed on the partition bar to achieve partitioning. In a more specific embodiment, the thickness of the second layer 162 ranges from 0.5 to 5 μm.

In some embodiments, the width of the second layer 162 is narrower than the width of the first layer 161, so that a portion of the bottom surface of the first layer 161 does not contact the second layer 162. The bottom surface of this portion and a side surface of the second layer 162 define a side etching channel 170. The side etching channel 170 makes it impossible for the common layer to completely cover the side surface of the partition bar 160 during deposition, which further ensures the partition of the common layer. In order to make such a structure, the material of the first layer 161 is selected to have greater etching resistance than the material of the second layer 162. After the first layer 161 and the semi-fabricated second layer 162' with flushed side surfaces are formed on the interlayer dielectric layer 115 using a method such as dry etching, the two layers can be etched using a wet etching process. The term semi-fabricated second layer 162' is a layer formed of a material of the second layer formed on the interlayer dielectric layer 115 after etching, the side of which is aligned with the first layer 161, which can be understood as a form before being the second layer 162. The material of the second layer, which has a worse etching resistance, is etched to a greater extent, so that the width of the material of the second layer is narrower, thereby forming a side etching channel 170. In some embodiments, the material of the first layer 161 may include at least one of titanium, gold, and platinum, and the material of the second layer 162 may include at least one of aluminum, copper, or silver.

In some embodiments, the layer arrangement of the partition bar 160 may be the same as that of the source and drain 120. Specifically, the partition bar 160 and the source and drain 120 may both have a two-layer structure, and the material of the first layer 161 of the partition bar 160 is the same as that of the third layer 123 of the source and drain 120 mentioned above. The material of the second layer 162 of the partition bar 160 is the same as that of the fourth layer 122 of the source and drain 120 mentioned above. In this way, the material of the first layer and the material of the second layer with the side edges aligned, that is, the first layer 161 and the semi-fabricated second layer 162', can be formed while the source and drain 120 are formed.

FIG. 5 schematically illustrates a cross-sectional view of a display panel according to another embodiment of the present disclosure. FIG. 6 schematically illustrates an enlarged view of a partial structure of the display panel of FIG. 5. In this display panel, the partition bar 160 has a three-layer structure. The partition bar 160 may include three portions in a vertical direction, wherein the width of the middle portion is smaller than those of the upper portion and the lower portion. Specifically, in addition to the first layer 161 and the second layer 162 mentioned above, the partition bar 160 may further include a fifth layer 163 closer to the substrate 100 than the second layer 162. In some embodiments, the source and drain 120 may also have a three-layer structure, that is, in addition to the third layer 123 and the fourth layer 122, a sixth layer 121 closer to the substrate 100 is also included. In some embodiments, the material of the fifth layer 163 and the material of sixth layer 121 may be the same, so that the partition bar 160 and the source and drain 120 may be formed synchronously.

An encapsulation layer 150 is arranged on the common layer. In some embodiments, the encapsulation layer 150 includes a first inorganic layer 151 and an organic layer 152 so as to block water and oxygen erosion. The first inorganic layer 151 covers the common layer, and at least a part of the first inorganic layer 151 fills the side etching channel 170 so that there is physical insulation between the common layers that are partitioned. In some embodiments, a second inorganic layer 153 may be further formed on the organic layer 152. The portions of the first inorganic layer 151 and the second inorganic layer 153 that are close to the aperture area HA may be connected together to surround the organic layer 152, so as to fully exert the water blocking performance of the first inorganic layer 151 and the second inorganic layer 153. In some embodiments, the first inorganic layer 151 is composed of one or more layers of silicon oxide, silicon nitride, silicon oxynitride, aluminum oxide, and aluminum nitride with high water resistance.

According to yet another aspect of the present disclosure, there is provided a method for manufacturing a display panel. FIG. 7 schematically illustrates a flowchart of a method for manufacturing a display panel according to an embodiment of the present disclosure. The display panel includes a display area AA, an aperture area HA, and an inner non-display area IVA between the display area AA and the aperture area HA. The display area AA is arranged with an electroluminescent device 140. The electroluminescent device 140 includes a common layer extending to the inner non-display area IVA. The method includes forming a partition bar 160 at least partially surrounding the aperture area HA in the inner non-display area IVA (step 200). The partition bar 160 is configured to partition the common layer. In this application, the related technologies for making the pixel circuit and the electroluminescent device 140 will not be described again.

Figure 8:
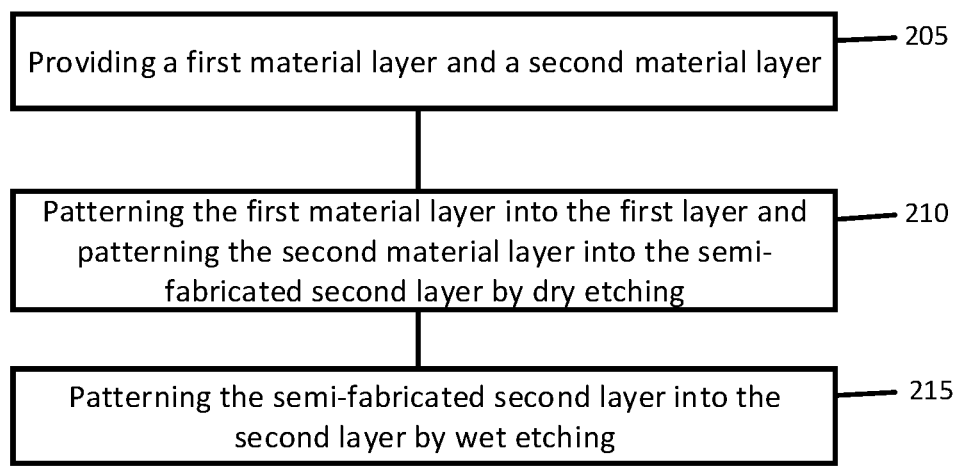
FIG. 8 schematically illustrates another flowchart of a method for manufacturing a display panel according to an embodiment of the present disclosure.

FIG. 8 schematically illustrates another flowchart of a method for manufacturing a display panel according to an embodiment of the present disclosure. In some embodiments, step 200 specifically includes:

205: providing a first material layer and a second material layer,

210: patterning the first material layer into the first layer 161 and patterning the second material layer into the semi-fabricated second layer 162' by dry etching, wherein the side surface of the first layer 161 is flush with the side surface of the semi-fabricated second layer 162'.

215: Patterning the semi-fabricated second layer 162' into the second layer 162 by wet etching, so that the portion of the bottom surface of the first layer 161 that does not contact the second layer 162 and the side of the second layer 162 defines a side etching channel 170.

Figure 9:
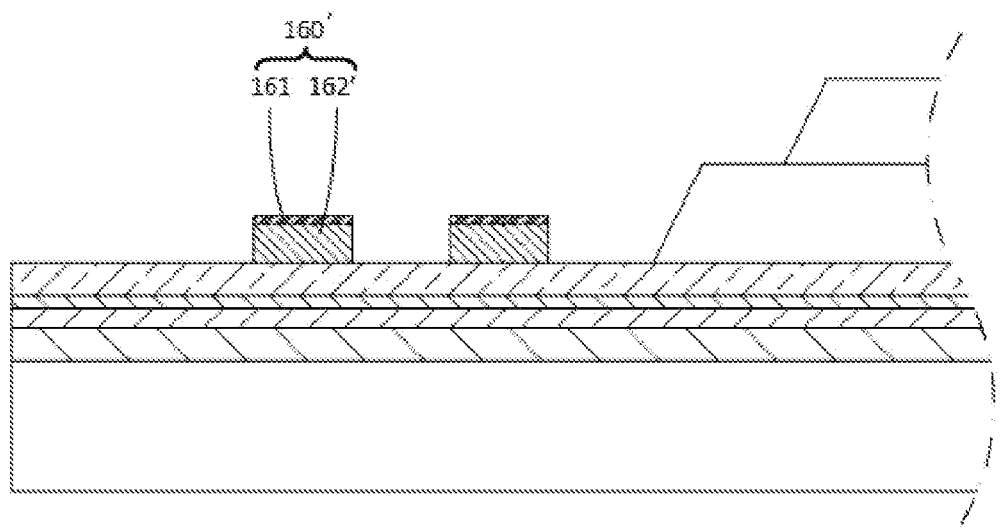
FIG. 9 schematically illustrates a staged structure of a display panel during manufacturing, according to an embodiment of the present disclosure.

The second material layer is an un-patterned layer formed by the material of the second layer 162 on the interlayer dielectric layer 115. The first material layer is an un-patterned layer formed by the material of the first layer 161 on the second material layer. That is, the first material layer is located above the second material layer. In some embodiments, the thickness of the second material layer is greater than the thickness of the common layer to be formed. Then, the first material layer and the second material layer are etched to obtain a semi-fabricated partition bar 160', which includes a first layer 161 and a semi-fabricated second layer 162'. The semi-manufactured second layer 162' is a layer formed of the second material layer after etching, with the side aligned with the first layer 161, which can be understood as an intermediate form being between the second material layer and the second layer 162. FIG. 9 schematically illustrates a staged structure of the display panel of FIG. 3 during the manufacturing, that is, a structure of a semi-manufactured partition bar 160' formed through step 210.

In some embodiments, the first material layer and the second material layer may be patterned by dry etching. The directional characteristics of the dry etching process make the topography of the side surface of the etched layer more controllable. Therefore, the sides of the first layer 161 and the semi-fabricated second layer 162' formed by the dry etching process can be kept substantially flush. In some embodiments, the cross-section of the semi-fabricated partition bar 160' perpendicular to the substrate 100 may be rectangular or trapezoidal.

Figure 10:
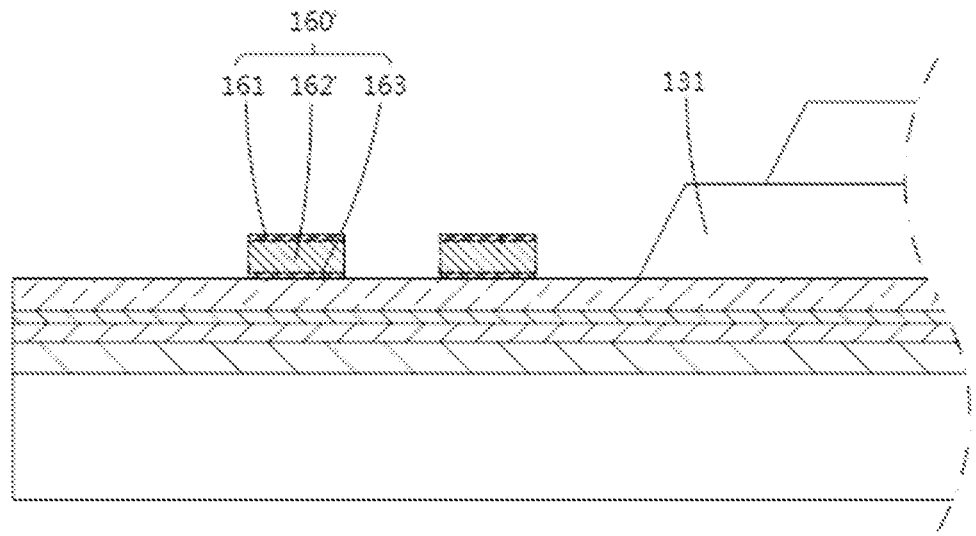
FIG. 10 schematically illustrates a staged structure of a display panel during manufacturing, according to another embodiment of the present disclosure.

FIG. 10 schematically illustrates a staged structure of the display panel of FIG. 5 during the manufacturing. In the embodiment of FIG. 5, the partition bar 160 adopts a three-layer structure, that is, it includes a first layer 161, a second layer 162, and a fifth layer 163. In this case, step 210 may further include patterning the fifth material layer into a fifth layer 163 by dry etching. The side surface of the fifth layer 163 is substantially flush with the side surfaces of the first layer 161 and the semi-fabricated second layer 162'.

In some embodiments, the layer arrangement of the partition bar 160 is the same as the layer arrangement of the source and drain 120 of the pixel circuit, that is, the partition bar 160 and the source and drain 120 include the same number of layers, and the partition bar 160 is arranged from top to bottom with the first layer 161 and the second layer 162, and the source and drain 120 are arranged from the top to bottom with the third layer 123 and the fourth layer 122, and the materials of the first layer 161 and the third layer 123 are the same, and the materials of the second layer 162 and the fourth layer 122 are the same. When the source and drain 120 and the partition bar 160 both adopt a three-layer structure, a fifth layer 163 is further arranged under the second layer 162 of the partition bar 160 and a sixth layer 121 is further arranged under the fourth layer 122 of the source and drain, and the materials of the fifth layer 163 and the sixth layer 121 are the same. In this case, forming the semi-fabricated partition bar 160' may be performed in the same step as forming the source and drain 120. That is, while the first material layer is patterned into the first layer 161 by the dry etching and the second material layer is patterned into the semi-fabricated second layer 162', the source and drain 120 of the pixel circuit is formed in the same step.

Then, the semi-fabricated second layer 162' is patterned into a second layer 162, so that the portion of the bottom surface of the first layer 161 that is not in contact with the second layer 162 and the side surface of the second layer 162 define a side etching channel 170. Through this step, the partition bar 160 can be formed. In some embodiments, this step may be formed by wet etching. Because the material of the second layer 162 has poorer etching resistance and is prone to erosion by the etching solution while the material of the first layer 161 has better etching resistance, the semi-fabricated second layer 162' is etched inward from the side surface, thereby forming a second layer 162 with the width smaller than the first layer 161. In some embodiments, the semi-fabricated second layer 162' may be etched using an acidic etching solution.

In some embodiments, the material of the second layer 162 may be the same as the anode 132 of the electroluminescent device 140. In this case, the second layer 162 and the anode 132 may be formed in the same step at the same time. Specifically, in some embodiments, after forming the semi-fabricated partition bar 160' and the source and drain 120, a planarization layer 131, a first aperture 135, and an anode material layer may be formed. Then, while the semi-fabricated second layer 162' is patterned into the second layer 162, the anode material layer arranged on the planarization layer 131 and the first aperture 135 is patterned in the same patterning process, thereby forming the anode 132 of the electroluminescent device 140.

Thereafter, a pixel definition layer 133, a second aperture 136, and a light emitting material layer 141 during electroluminescence 140 may be formed on the anode 132. The light emitting material layer 141 may be patterned by a fine metal mask process (FMM). Then, a method such as evaporation and inkjet printing can be used to form a common layer using the Open Mask. The common layer is partitioned due to the presence of the partition bar 160. At the partition bar 160, the common layer is formed only above the partition bar 160 and is not formed on the side of the partition bar 160, that is, the side etching channel 170 is exposed. In some embodiments, the common layer 160 may be formed by an evaporation method. The directionality of the evaporation process is better, so that the form of the common layer 160 on the partition bar is easier to be controlled, and thus improving the stability of the partition effect.

After the common layer 160 is formed, a first inorganic layer 151 may be deposited on the common layer 160. At least part of the first inorganic layer 151 fills the side etching channel 170, so that the part of the common layer on the partition bar 160 is completely encapsulated by the first inorganic layer 151, and the common layer is physically isolated. In some embodiments, the deposition of the first inorganic layer 151 may be achieved by chemical vapor deposition or atomic layer deposition. Chemical vapor deposition and atomic layer deposition have good pattern coverage, can fill the side etching channel 170 of the partition bar 160, make the common layer susceptible to water and oxygen erosion to be partitioned by the first inorganic layer 151, and block the pathway of water and oxygen intrusion. An organic layer 152 may be provided on the first inorganic layer 151. The characteristics of the organic layer 152 make the thickness of the its portion near the aperture area HA gradually thinner. In some embodiments, a second inorganic layer 153 may also be provided on the organic layer 152, so that a portion of the second inorganic layer 153 close to the aperture area HA and a portion of the first inorganic layer 151 close to the aperture area HA are connected together, and wrapped with the organic layer 152 to fully exert the water blocking performance of the inorganic layer. The edge of the organic layer 152 preferably covers the range of the partition bar, so that the second inorganic layer 153 can be deposited on a relatively smooth surface, and thereby improving the reliability of the film layer.

After the encapsulation is completed, a method such as mechanical, laser, etching, etc. can be used to open a hole throughout the aperture area HA for other subsequent processes.

Figure 11:
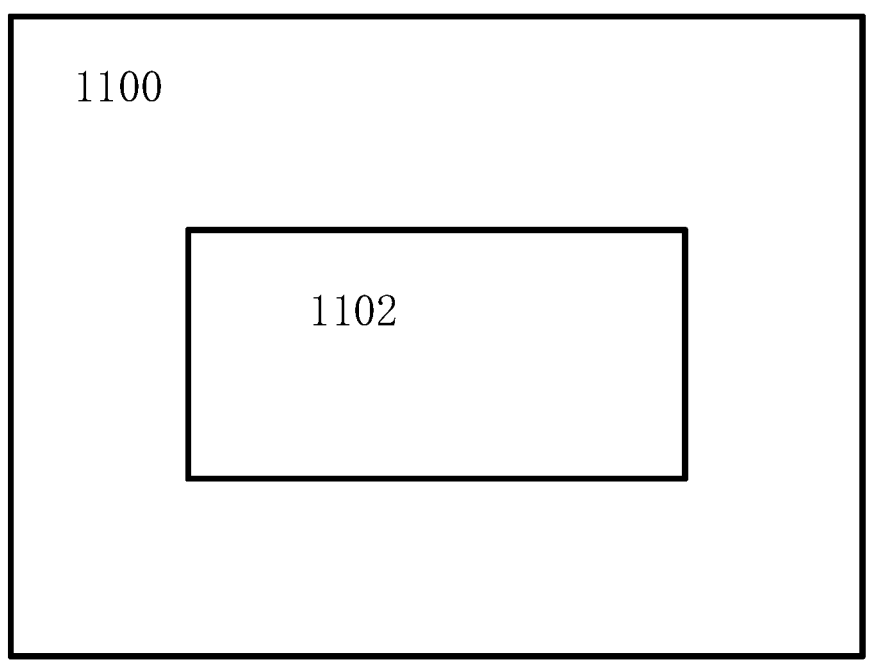
FIG. 11 schematically illustrates a display device according to an embodiment of the present disclosure.

According to another aspect of the present disclosure, there is also provided a display device including a display panel according to an embodiment of the present disclosure. FIG. 11 illustrates a display device 1100 including a display panel 1102 according to an embodiment of the present disclosure. The display panel 1102 may be a display panel according to an embodiment of the present disclosure as described above. The display panel according to the present disclosure can be applied to various display devices, including but not limited to mobile phones, tablet computers, personal digital assistants, smart watches, car displays, digital cameras, notebook computers, head-up displays, wearable devices, virtual reality devices as well as augmented reality devices.

In summary, the present disclosure provides a display panel, a display device, and a method for manufacturing a display panel. The display panel includes a display area, an aperture area, and an inner non-display area between the display area and the aperture area. The display area is arranged with an electroluminescent device and a pixel circuit. The electroluminescent device includes a common layer extending to the inner non-display area. The inner non-display area is arranged with a partition bar that at least partially surrounds the aperture area. The common layer located in the inner non-display area is partitioned by the partition bar. Since the common layer is partitioned, the erosion to the common layer by water and oxygen from the aperture area is prevented at the partition bar, so the common layer in the display area will not be subjected to erosion by water and oxygen, thereby increasing the reliability of the display panel.

It will be appreciated that the above embodiments are described by way of example only. Although the embodiments have been illustrated and described in detail in the drawings and the foregoing description, such illustrations and descriptions are to be considered illustrative or exemplary and not restrictive, and the invention is not limited to the disclosed embodiments. In addition, it should be understood that the elements in the drawings of the present application are not necessarily drawn to scale, and the dimensions shown in the drawings do not represent the actual or relative sizes of the elements.

Through studying the drawings, the disclosure, and the appended claims, those skilled in the art can understand and reach other modifications to the disclosed embodiments when practicing the claimed invention. In the claims, the word "comprising" does not exclude other elements or steps, and the indefinite article "a" does not exclude plural. A single processor or other unit may fulfill the functions of several items recited in the claims. The mere fact that certain measures are recited in mutually different dependent claims does not indicate that a combination of these measures cannot be used to make advantage. Any reference signs in the claims should not be construed as limiting the scope. The use of the words first, second, third, fourth, fifth, sixth and similar words does not imply any ordering. These words will be interpreted as names.

What is claimed is:

1. A display panel comprising:
    a display area,
    an aperture area, and
    an inner non-display area between the display area and the aperture area, wherein
    the display area is arranged with an electroluminescent device and a pixel circuit, the electroluminescent device comprising a common layer extending to the inner non-display area, wherein the pixel circuit includes a thin film transistor, and a source and a drain of the thin film transistor includes a third layer and a fourth layer, wherein the third layer is farther from a substrate of the display panel than the fourth layer; and,
    the inner non-display area is arranged with a partition bar at least partially surrounding the aperture area, wherein the partition bar includes a first layer and a second layer, the first layer is farther from the substrate of the display panel than the second layer, the width of the first layer is greater than the width of the second layer, and the material of the first layer has greater etching resistance than the material of the second layer; and
    the common layer located in the inner non-display area is partitioned by the partition bar, the material of the third layer is the sane as that of the first layer, and the material of the fourth layer is the same as that of the second layer.

2. The display panel according to claim 1, wherein the first layer includes a bottom surface facing the second layer, and a portion of the bottom surface that does not contact the second layer and a side surface of the second layer define a side etching channel.

3. The display panel according to claim 2, further comprising an inorganic layer covering the common layer, wherein at least a portion of the inorganic layer fills the side etching channel.

4. The display panel according to claim 1, wherein the thickness of the second layer in a direction perpendicular to the substrate is greater than the thickness of the common layer in a direction perpendicular to the substrate.

5. The display panel according to claim 1, wherein the thickness of the second layer in a direction perpendicular to the substrate ranges from 0.5 to 5 µm.

6. The display panel of claim 1, wherein the material of the first layer includes at least one of titanium, gold, and platinum, and the material of the second layer includes at least one of aluminum, copper, or silver.

7. The display panel according to claim 1, wherein the partition bar further includes a fifth layer closer to the substrate than the second layer, and the width of the fifth layer is greater than that of the second layer.

8. The display panel according to claim 7, wherein the source and the drain further include a sixth layer closer to the substrate than the fourth layer, and wherein the material of the fifth layer is the same as that of the sixth layer.

9. The display panel according to claim 1, wherein the thin film transistor further includes a first gate dielectric layer, a second gate dielectric layer and an interlayer dielectric layer, the first gate dielectric layer, the second gate dielectric layer and the interlayer dielectric layer extend to the inner non-display area.

10. The display panel according to claim 1, wherein the common layer includes a common organic layer and a cathode.

11. The display panel according to claim 1, wherein the electroluminescent device includes an organic light emitting diode device and a quantum dot light emitting diode device.

12. A display device comprising a display panel, comprising:
    a display area,
    an aperture area, and
    an inner non-display area between the display area and the aperture area, wherein
    the display area is arranged with an electroluminescent device and a pixel circuit, the electroluminescent device comprising a common layer extending to the inner non-display area, wherein the pixel circuit includes a thin film transistor, and a source and a drain of the thin film transistor includes a third layer and a fourth layer, wherein the third layer is farther from a substrate of the display panel than the fourth layer; and,
    the inner non-display area is arranged with a partition bar at least partially surrounding the aperture area, wherein the partition bar includes a first layer and a second layer, the first layer is farther from the substrate of the display panel than the second layer, the width of the first layer is greater than the width of the second layer, and the material of the first layer has greater etching resistance than the material of the second layer, and
    the common layer located in the inner non-display area is partitioned by the partition bar, the material of the third layer is the same as that of the first layer, and the material of the fourth layer is the same as that of the second layer.

13. The display device according to claim 12, wherein the first layer includes a bottom surface facing the second layer, and a portion of the bottom surface that does not contact the second layer and a side surface of the second layer define a side etching channel.

14. A method for manufacturing a display panel, wherein the display panel comprises a display area, an aperture area, and an inner non-display area between the display area and the aperture area, and the display area is arranged with an electroluminescent device and a pixel circuit, the electroluminescent device comprising a common layer extending to the inner non-display area, the pixel circuit including a thin film transistor, and a source and a drain of the thin film transistor including a third layer and a fourth layer, the inner non-display area being arranged with a partition bar at least partially surrounding the aperture area, the partition bar including a first layer and a second layer, the width of the first layer being greater than the width of the second layer, the common layer located in the inner non-display area being partitioned by the partition bar, the method comprising:

providing a first material layer and a second material layer, wherein the first material layer is farther from a substrate of the display panel than the second material layer, a material of the first material layer having greater etching resistance than a material of the second material layer;

forming the first material layer within the inner non-display area into the first layer and forming the first material layer within the display area into the third layer; and forming the second material layer within the inner non-display area into the second layer and forming the second material layer within the display area into the fourth layer.

15. The method of claim 14, wherein forming the first material layer within the inner non-display area into the first layer and forming the second material layer within the inner non-display area into the second layer comprise:

patterning the first material layer into the first layer and patterning the second material layer into a semi-fabricated second layer by dry etching, wherein a side surface of the first layer is flush with a side surface of the semi-fabricated second layer, and patterning the semi-manufactured second layer into the second layer by wet etching, so that a portion of a bottom surface of the first layer that does not contact the second layer and a side surface of the second layer define a side etching channel.

16. The method of claim 15, further comprising:

forming an inorganic layer covering the common layer by chemical vapor deposition or atomic layer deposition, wherein at least part of the inorganic layer fills the side etching channel.

17. The method of claim 16, further comprising:

forming the source and the drain of the pixel circuit while patterning the first material layer into the first layer and patterning the second material layer into the semi-fabricated second layer by dry etching.

18. The method of claim 16, further comprising:

forming an anode of the electroluminescent device while patterning the semi-manufactured second layer into the second layer by wet etching.

* * * * *

UNITED STATES PATENT AND TRADEMARK OFFICE
CERTIFICATE OF CORRECTION

PATENT NO. : 11,469,392 B2
APPLICATION NO. : 16/649530
DATED : October 11, 2022
INVENTOR(S) : Ziyu Zhang et al.

It is certified that error appears in the above-identified patent and that said Letters Patent is hereby corrected as shown below:

In the Claims

Column 11, Line 60, Claim 1, delete "sane" and insert -- same --

Column 12, Line 57, Claim 12, delete "layer," and insert -- layer; --

Signed and Sealed this
Twentieth Day of December, 2022

Katherine Kelly Vidal
*Director of the United States Patent and Trademark Office*